United States Patent [19]
Ilg et al.

[11] Patent Number: 6,130,145
[45] Date of Patent: *Oct. 10, 2000

[54] INSITU DOPED METAL POLICIDE

[75] Inventors: Matthias Ilg, Richmond, Va.;
Johnathan Faltermeier, Fishkill, N.Y.;
Radhika Srinivasan, Mahwah, N.J.

[73] Assignees: Siemens Aktiengesellschaft, Munich, Germany; International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/010,081

[22] Filed: Jan. 21, 1998

[51] Int. Cl.[7] .................... H01L 21/3205; H01L 21/4763
[52] U.S. Cl. ............................. 438/592; 438/655
[58] Field of Search ...................... 438/592, 655

[56] References Cited

U.S. PATENT DOCUMENTS

| | | | |
|---|---|---|---|
| 4,443,930 | 4/1984 | Hwang et al. | 29/571 |
| 5,428,244 | 6/1995 | Segawa et al. | 257/646 |
| 5,756,392 | 5/1998 | Lu et al. | |
| 5,827,762 | 10/1998 | Bashir et al. | |
| 5,837,601 | 11/1998 | Matsumoto | |
| 5,897,365 | 4/1999 | Matsubara | |

FOREIGN PATENT DOCUMENTS 0 860 863 A2  8/1998  European Pat. Off.

OTHER PUBLICATIONS

"Formation of Low–Resistivity Gate Electrode Suitable for the Future Devices Using Clustered DCS–Wsix Polycide", Byun et al., Extended Abstracts of the 1997 International Conference on Solid State Devices and Materials, Hamamatsu, 1997, pp. 282–283.

IEEE Publication entitled in Situ Deposited Wsix Policide for High Frequency Transistor Gate Structutres by Lu et al. Patent Abstract of Japan, Publication No. 61251170, dated Aug. 11, 1986.

*Primary Examiner*—John F. Niebling
*Assistant Examiner*—Jonathan Hack
*Attorney, Agent, or Firm*—Stanton C. Braden

[57] ABSTRACT

A reduced metal-rich interface between a poly and metal silicide layer is achieved by insitu doping the metal silicide layer.

16 Claims, 2 Drawing Sheets

INSITU DOPED METAL POLICIDE

The field of the present invention relates generally to semiconductor fabrication and, more particularly, to transistors with polysilicon-silicide gates.

BACKGROUND OF THE INVENTION

In device fabrication, insulating, semiconducting, and conducting layers are formed on a substrate. The layers are patterned to create features and spaces. The features and spaces are patterned so as to form devices, such as transistors, capacitors, and resistors. These devices are then interconnected to achieve a desired electrical function, creating an integrated circuit (IC).

To reduce sheet resistance, a metal oxide semiconductor (MOS) transistor employs a polycide gate. The polycide gate comprises metal silicide, such as tungsten silicide ($WSi_x$) over heavily doped polysilicon (poly). Typically, the poly is doped with phosphorus (P). The poly should contain a high dopant concentration to lower its sheet resistance.

However, metal silicide over heavily doped poly exhibits stoichiometric control problems, which are expressed in the form of a metallic-rich interface. A metallic-rich interface is undesirable since it is not resistant to subsequent thermal processes. As a result, the interface gets oxidized. Oxidation causes surface roughness and, in some cases, delamination of the silicide film. Conventionally, the adverse effects of the metallic rich interface are avoided by providing an intrinsic (undoped) layer of poly between the heavily doped poly and the metal silicide. The addition of the undoped poly layer increases the height of the gate stack, increasing the aspect ratio of the gate stack. Decreasing the groundrules further increases the aspect ratio, resulting in process problems. Further, the addition of the undoped poly layer also increases the gate resistance, which decreases device performance. Another technique that avoids a metal-rich interface is to lower the dopant concentration of the poly. Typically, the P concentration of the poly layer should be kept below $10^{20}$ atoms/cm$^3$. Such technique also undesirably increases the gate resistance.

From the above description, it is desirable to provide a reliable polycide gate with reduced sheet resistance.

SUMMARY OF THE INVENTION

The invention relates to formation of a reliable gate conductor with decreased thickness and lower sheet resistance. In one embodiment, decreased thickness and lower sheet resistance are achieved by depositing an insitu doped metal silicide layer over a doped poly layer. The dopants in the metal silicide layer reduces problems associated with metal rich inteface. This allows a metal silicide layer to be deposited without an intrinsic cap poly layer or requiring the poly to have a lower dopant concentration.

DESCRIPTION OF THE INVENTION

The present invention relates to a reliable polycide gate with reduced sheet resistance. To facilitate discussion of the invention, it is described in the context of a memory IC. However, the invention is significantly broader and is applicable to ICs in general. A description of a DRAM cell is provided.

Figure 1:
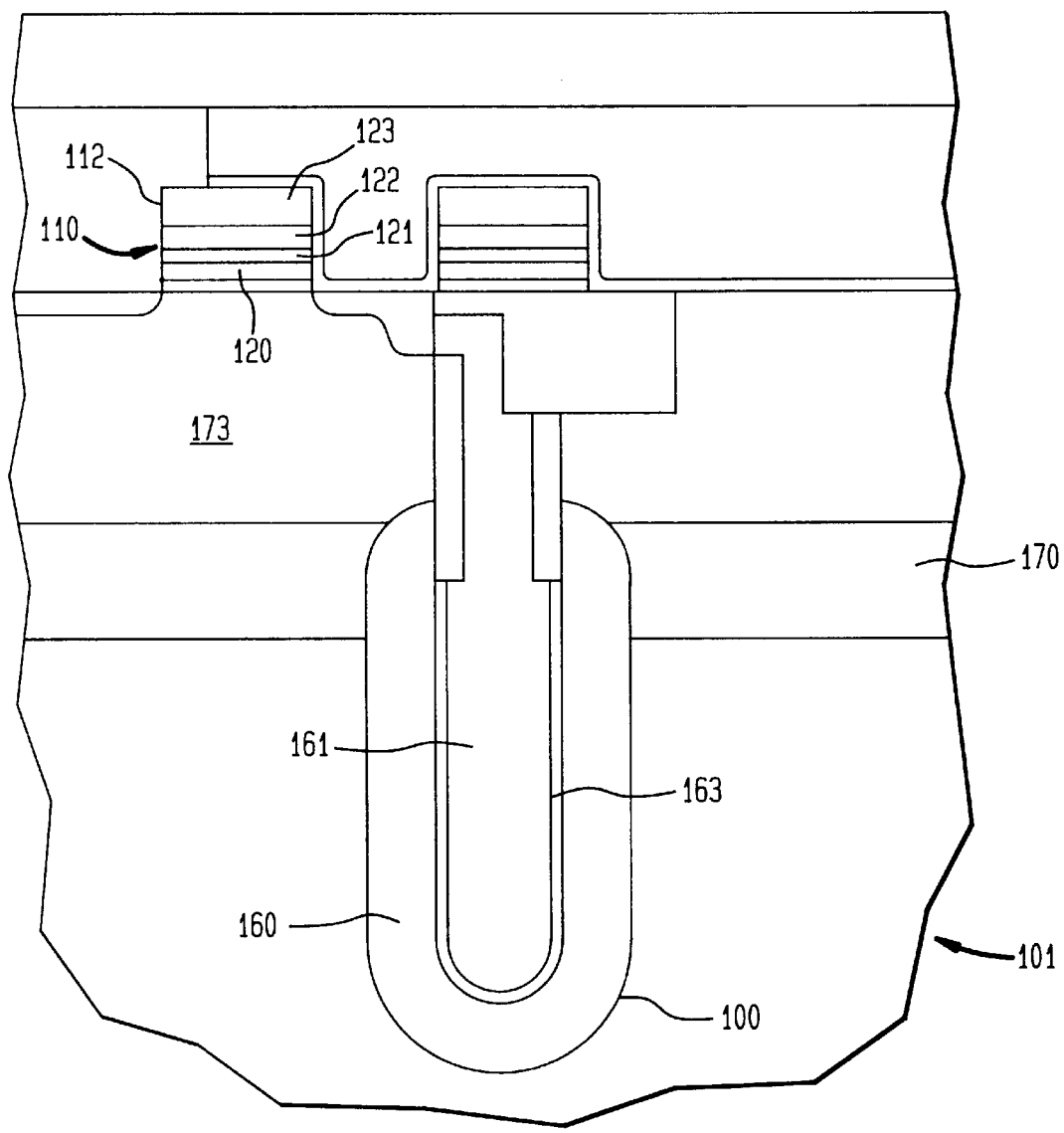
FIG. 1 illustrates an illustrative DRAM cell.

Referring to FIG. 1, a trench capacitor type DRAM cell 100 is shown. Such trench capacitor DRAM cell is described in, for example, Nesbit et al., *A 0.6 μm $^2$256Mb Trench DRAM Cell With Self-Aligned Buried Strap (BEST)*, IEDM 93–627, which is herein incorporated by reference for all purposes. Although a trench capacitor DRAM cell is shown, the invention is not limited to such. For example, a stack capacitor DRAM cell can also be used. Typically, an array of such cells is interconnected by wordlines and bitlines to form a DRAM IC.

Illustratively, the DRAM cell 100 comprises a trench capacitor 160 formed in a substrate 101. The trench is filled with, typically, polysilicon (poly) 161 that is heavily doped with dopants having a first conductivity such as n-type. The doped poly serves as an electrode of the capacitor, referred to as a "storage node." Optionally, a buried plate 165 doped with dopants of the first conductivity surrounds the lower portion of the trench. The buried plate serves as another electrode of the capacitor. In the upper portion of the trench is a collar 168 to reduce parasitic leakage. A node dielectric 163 separates the two plates of the capacitor. A buried well 170 comprising dopants of the first conductivity is provided to connect the buried plates of the DRAM cells in the array. Above the buried well is a well 173 comprising dopants having a second conductivity, such as p-type. The p-well comprises a dopant concentration sufficient to form an opposite conductivity junction to reduce vertical leakage of a transistor 110.

The transistor includes a polycide gate stack 112. The gate stack, which is sometimes referred to as a "gate conductor" (GC), serves as a wordline in the DRAM array. Since the wordline is connected to the capacitor, it is referred to as the "active wordline." As shown, the gate stack includes a poly layer 120 that is heavily doped with dopants. In one embodiment, the poly layer 120 is heavily doped with P dopants. The use of boron (B) or arsenic (As) dopants is also useful. To keep the sheet resistance low, the dopant concentration of the poly should be sufficiently high. Above the heavily doped poly 120 are provided an intrinsic poly layer 121 and a metal silicide layer 122. The intrinsic poly layer serves as a buffer layer to avoid a metal rich interface between the silicide and heavily doped poly layers. Although dopants from the heavily doped poly layer diffuse into the intrinsic poly during the subsequent thermal processes, the poly is intrinsic during initial deposition of the metal silicide layer. Above the metal silicide layer is, for example, a nitride layer that serves as an etch stop layer.

Heavily doped diffusion regions 113 and 114 are provided adjacent to the gate. The diffusion regions comprise dopants having the same conductivity as the poly layer and opposite that of well 173. The diffusion region, for example, is heavily doped with n-type dopants. Depending on the direction of current flow, the diffusion regions 113 and 114 are either referred to as the "drain" or "source," respectively. As used herein, the terms "drain" and "source" are interchangeable. Connection between the transistor and the capacitor is achieved via a diffusion region 125, referred to as the "node diffusion."

A shallow trench isolation (STI) 180 is provided to isolate the DRAM cell from other cells or devices. As shown, a wordline 120, is formed over the trench and isolated therefrom by the STI. Wordline 120 is referred to as the "passing wordline" since it is not electrically coupled to the DRAM cell. Such configuration is referred to as a folded bitline architecture. Other configurations including open and open-folded are also useful.

An interlevel dielectric layer 189 is formed over the wordlines. A conductive layer 190, representing a bitline, is formed over the interlevel dielectric layer. A bitline contact opening 186 is provided in the interlevel dielectric layer to contact the source 113 to the conductive layer 190 (bitline).

As previously discussed, the use of the poly buffer layer between the heavily doped poly and silicide layer increases the thickness of the gate stack. This increased thickness is undesirable because it produces higher aspect ratio features, creating processing difficulties.

Figure 2A:
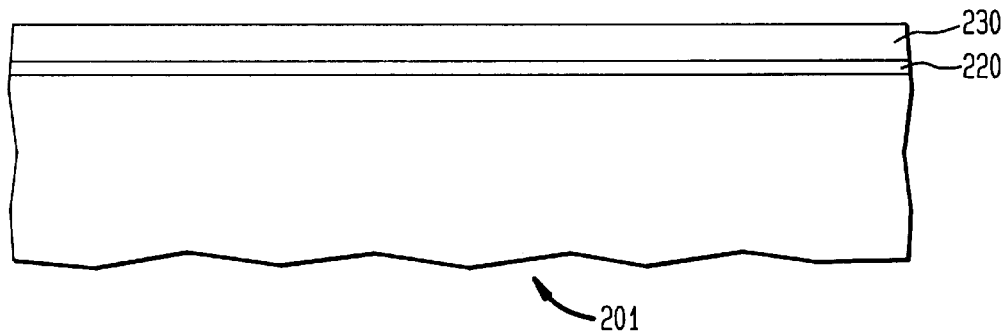
FIGS. 2a–c show an embodiment of the invention for forming a polycide gate stack.
Figure 2B:
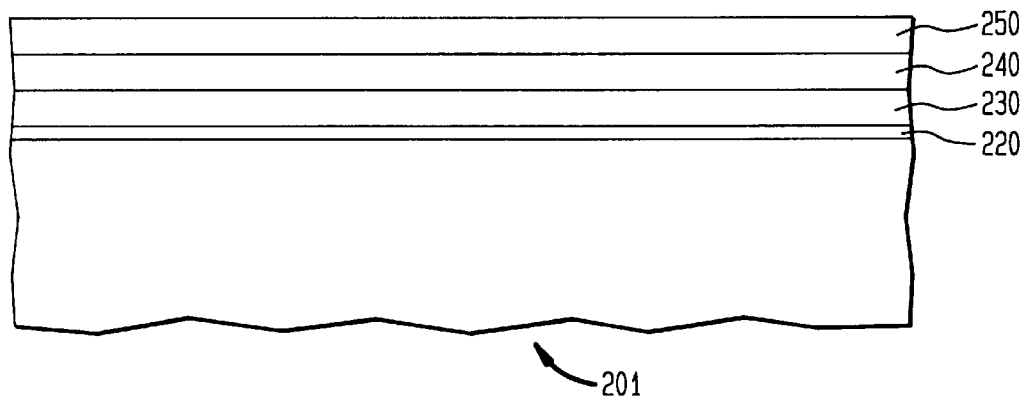
Figure 2C:
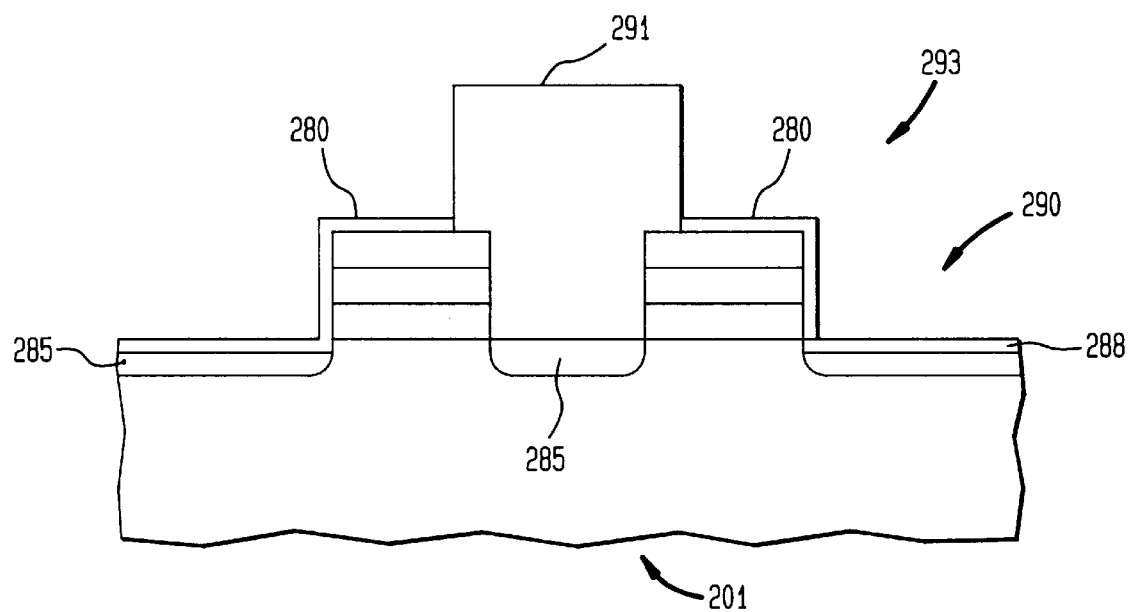

FIGS. 2*a*–*c* show the process of forming a polycide gate stack in accordance with the invention. Referring to FIG. 2*a*, a schematic cross section of a substrate representing a portion of an IC is shown. Such an IC, for example, is a memory IC including a random access memory (RAM), a dynamic RAM (DRAM), a synchronous DRAM (SDRAM); a static RAM (SRAM), and a read only memory (ROMs). Also, the IC may be a logic device such as a programmable logic array (PLA), an application specific IC (ASIC), a merged DRAM-logic IC (embedded DRAM) or any other logic device.

Typically, numerous ICs are fabricated on a semiconductor substrate, such as a silicon wafer, in parallel. After processing, the wafer is diced in order to separate the ICs into a plurality of individual chips. The chips are then packaged into final products for use in, for example, consumer products such as computer systems, office equipment including copiers, printers, and facsimile systems, cellular phones, personal digital assistants (PDAs), and other electronic products.

The substrate 201 is, for example, a silicon wafer. Other substrates such as silicon on insulator (SOI), silicon on sapphire (SOS), germanium, gallium arsenide, and group III–V compounds, are also useful. In one embodiment, the substrate is lightly doped with dopants having a first conductivity. Although the substrate as shown does not include other device layers device features, it is understood that the term "substrate" as used herein may include a substrate having one or more device layers and device features thereon. In one embodiment, the substrate is lightly doped with p-type dopants (p$^-$), such as B. The concentration of B is about $1.5 \times 10^{16}$ atoms/cm$^3$.

The substrate, for example, includes a plurality of trench capacitors (not shown) formed therein. The trench capacitors, for example, are those described in FIG. 1. In one embodiment, the trench capacitors serve as storage capacitors for n-channel DRAM cells. Buried n-wells are provided to connect the n-type buried plates of the capacitors together. P-wells are provided for the n-channel DRAM access transistors. The concentrations of the p-wells is about $5 \times 10^{17} - 8 \times 10^{17}$ cm$^{-3}$. Additionally, n-type wells are provided for p-channel transistors, such as those employed in support circuitry. Other diffusion regions may be provided in the substrate as necessary.

At this point of processing, the substrate includes a planar surface 210. A sacrificial oxide layer (not shown) is formed over the surface. The sacrificial oxide layer serves as a screen oxide for implanting ions to adjust the gate threshold voltage ($V_t$) of the subsequently formed transistors. The $V_t$ adjust implant employs, for example, conventional lithographic and masking techniques to selectively implant the dopants into the channel region of the gate. Such techniques include depositing a photoresist layer over the screen oxide layer and selectively exposing it with an exposure source and mask. Depending on whether a positive or negative resist is used, either the exposed or unexposed portions of the resist layer are removed during development to selectively expose regions of the substrate below. The exposed regions are then implanted with ions to achieve the desired $V_t$.

After the $V_t$ implant, the resist and screen oxide layers are removed by, for example, a wet etch. A thin oxide layer 220 is then formed on the substrate surface. The oxide layer serves as the gate oxide. In one embodiment, the gate oxide is grown by thermal oxidation. The thickness of the gate oxide is, for example, about 6–10 nm.

A poly layer 230 is deposited over the gate oxide. The poly layer is deposited by, for example, chemical vapor deposition (CVD). Alternatively, an amorphohous silicon layer can be used instead of poly. Typically, the poly layers comprise dopants to reduce its resistivity. Such dopants, for example, include phosphorus (P), arsenic (As), or boron (B). The poly layer can be doped during or after its formation. Incorporating the dopants during the CVD process is known as insitu doping.

In one embodiment, the poly layer is doped with P dopants. The poly is insitu doped. The concentration of P dopants is about $10^{19} - 5 \times 10^{21}$ atoms/cm$^3$, preferably about $10^{20} - 10^{21}$ atoms/cm$^3$, and more preferably about $5 \times 10^{20}$. The poly is deposited in a CVD reactor, for example, at a temperature of about 600–650° C. and a pressure of about 100–180 Torr using SiH$_4$ as a silicon precursor and PH$_3$ as a P dopant source. The thickness of the doped poly is about 10–200 nm, preferably about 40–150 nm and, more preferably about 50–100 nm. Of course, the actual thickness can vary depending on various factors. For example, a minimum thickness is required for work function purposes and this depends on design requirements. This minimum thickness, in some cases, can be as low as about 10 nm.

Referring to FIG. 2*b*, which is a schematic cross section, a metal silicide layer 240 is deposited over the poly layer 230. The metal silicide comprises, for example, tungsten silicide (WSi$_x$), molybdenum silicide (MoSi$_x$), tantalum silicide (TaSi$_x$), titanium silicide (TiSi$_x$), cobalt silicide (CoSi$_x$)., or other metal silicides. In accordance with one embodiment, the metal silicide comprises dopants, which are either p- or n-type. Such dopants include, for example, P, As, or B. The dopant type is the same, when applicable, as the doped poly layer 230. Typical concentration of the metal silicide layer is about $10^{19} - 5 \times 10^{21}$ atoms/cm$^3$, preferably about $10^{20} - 10^{21}$ atoms/cm$^3$, and more preferably $5 \times 10^{20}$ atoms/cm$^3$. Insitu doping the metal silicide potentially increases the tendency that it will be deposited in its amorphous state. Depositing the metal silicide in its amorphous state increases the grain size of the film, thereby lowering its resistance.

The insitu doped metal silicide is deposited by conventional CVD techniques used to deposit an undoped metal silicide film. A dopant source is included in the CVD process to provide insitu doping of the deposited film.

In one embodiment, the doped metal silicide layer comprises P doped WSi$_x$. The WSi$_x$ is insitu doped. The concentration of P dopants is about $10^{19} - 5 \times 10^{21}$ atoms/cm$^3$, preferably about $10^{20} - 10^{21}$ atoms/cm$^3$, more preferably about $5 \times 10^{20}$ atoms/cm$^3$. The thickness of the doped metal silicide is about 50–200 nm, preferably about 80 nm. Of course, the actual thickness can vary depending on design and parameters.

Conventional W, Si, and dopant precursors are employed to form the doped WSi$_x$ film. Conventional Si precursors include, for example, silane (SiH$_4$), disilane (Si$_2$H$_6$), or dichlorosilane (SiH$_2$Cl$_2$); W precursors include tungsten hexaflouride (WF$_6$), tungsten hexachloride (WCl$_6$), or tungsten hexacarbonyl (W[CO]$_6$). Phosphine (PH$_3$ or POCl$_4$) is used, for example, to provide the P dopant source. In one embodiment, the PH$_3$ are added to WF$_6$ and SiH$_4$ to form the P doped WSi$_x$ film. The percursors are introduced in a CVD reactor, such as a Centura CVD reactor manufactured by Applied Materials located in Santa Clara, Calif. Typical temperatures and pressures for the CVD process are about 450–600° C. and about 1–5 Torr, respectively. Preferably, the temperature is about 550° C. and the pressure is about 1.5 Torr.

The addition of dopants to the metal silicide film during deposition reduces the formation of a metal rich interface. Although the mechanism for reducing the metal rich interface is not clear, it is believed that dopants enhance the efficiency of the metallic reaction. For example, the efficiency of the WF$_6$ reaction is enhanced. Since dopants are incorporated in the deposition process, the efficiency of the WF$_6$ reaction is enhanced throughout the deposition process. Therefore, W is distributed relatively uniformly throughout the WSi$_x$ film, avoiding a metallic-rich interface.

The ability to deposit a metal silicide film over a heavily doped layer without a metal rich interface enables the deposition of the metal silicide film over a heavily doped layer without an intrinsic cap poly layer. This is particularly advantageous, particularly with smaller groundrules, as it produces gate stacks having lower aspect ratios. Further, lower resistance is also achieved, increasing device performance.

Also, since a doped silicide layer is used, the poly layer can be undoped. An undoped amorphous silicon may be used instead of poly. The thickness of the undoped poly or amorphous silicon can be, for example, about 20–50 nm.

Thermal exposure during subsequent processing causes the dopants in the metal silicide and poly layers to diffuse. Optionally, an anneal is performed to diffuse the dopants in the layers. The anneal is designed to enhance or optimize film properties. The anneal is performed, for example, at a temperature of about 1000° C. at about atmospheric pressure. The ambient of the anneal includes, for example, oxygen (O$_2$), argon (Ar), or nitrogen (N$_2$). In the case where the poly layer comprises a dopant concentration lower than that of the silicide layer, the anneal increases the dopant concentration of dopants in the poly layer. By providing a doped silicide layer that serves as a dopant source, the poly layer can be formed with a dopant concentration below that which causes a metal-rich interface. The poly layer of the gate stack can thus comprise a higher dopant concentration without increasing its thickness to avoid a metal-rich interface. As a result, a reliable gate stack with low sheet resistance is provided.

Above the metal silicide layer 240 is formed a etch stop layer for subsequent processing. The etch stop layer 250, for example, comprises silicon nitride.

Referring to FIG. 2c, which is a schematic cross section, the gate stack layers are patterned to form gate conductors 280. Patterning of the gate conductors is achieved using conventional lithographic and etch techniques. Such techniques include depositing a resist layer and selectively exposing the resist layer with an exposure source and mask. Portions of the resist are removed after development to leave portions of the gate stacks unprotected. The unprotected portions of the gate stack are removed by, for example, a reactive ion etch (RIE).

Spacers (not shown) can be optionally formed on the sidewalls of the gate conductors. After spacer formation, dopants are implanted to form diffusion regions 285, which extend from planar surface 210 into substrate 201 adjacent the gate of the transistors. The spacers define the underlap diffusion of diffusion regions, which reduces overlap capacitance.

A nitride layer 288 is deposited over the surface of the substrate, serving a mobile ion barrier and as an etch stop for formation of borderless bitline contacts. A dielectric layer 290 is formed over the device structure to provide insulation between a conducting layer 293 and the gate conductors. The dielectric layer also serves as a protective layer to insulate the device structure from impurities, moisture, and scratches. The dielectric layer, for example, includes phosphorus-doped silicon dioxide such as phosphosilicate glass (PSG) or borophosphosilicate glass (BPSG).

Contact 291 is formed in the dielectric layer 290, providing a interconnection between the conductive layer 293 and an underlying conductive region 285. The conductive layer, for example, represents a bitline of the DRAM chip.

While the invention has been particularly shown and described with reference to various embodiments, it will be recognized by those skilled in the art that modifications and changes may be made to the present invention without departing from its scope. The scope of the invention should therefore be determined not with reference to the above description but with reference to the appended claims along with their full scope of equivalents.

We claim:

1. A method for forming a dynamic random access memory (DRAM) including a transistor having a polycide gate comprising:

forming an oxide layer over a substrate;

forming a polysilicon (poly) layer over the oxide layer;

depositing a metal silicide layer over the poly layer, the metal silicide layer being insitu doped with dopants of one conductivity type to reduce metal rich interface between the poly and metal silicide layers; and patterning the oxide, poly, and metal silicide layers to form the gate.

2. A method of fabricating a semiconductor device comprising:

forming a polysilicon (poly) layer on a substrate; and depositing a metal silicide layer over the poly layer, the metal silicide layer being insuti doped with dopants of one conductivity type to reduce metal rich interface between the poly and metal silicide layers.

3. The method of claim 2 wherein the dopants are selected from the group consisting of n-type or p-type dopants.

4. The method of claim 3 wherein the n-type dopants are selected from the group consisting of arsenic or phosphorus and the p-type dopants comprises boron.

5. The method of claim 4 wherein the poly layer comprises dopants.

6. The method of claim 5 wherein the dopants in the poly layer is of the same dopant type as the metal silicide layer.

7. The method of claim 6 wherein the metal silicide and poly layer comprises n-type dopants.

8. The method of claim 7 wherein the n-type dopants comprise phosphorus.

9. The method of claim 8 wherein the concentration of dopants in the metal silicide layer is about $10^{19}$ to $5 \times 10^{21}$.

10. The method of claim 9 wherein the concentration of dopants in the poly layer is about $10^{19}$ to $5 \times 10^{21}$.

11. The method of claim 10 wherein the metal silicide is selected from the group comprising tungsten, molybdenum, tantalum, titanium, and cobalt.

12. The method of claim 11 wherein the metal silicide comprises tungsten.

13. The method of claim 12 wherein the metal silicide is deposited by chemical vapor deposition (CVD).

14. The method of claim 13 wherein a silicon precursor, a tungsten precursor, and a dopant precursor are used for the CVD.

15. The method of claim 14 wherein the silicon precursor is selected from the group comprising $SiH_4$, $Si2H_6$, or $SiH_2Cl_2$, the tungsten precursor is selected from the group comprising $WF_6$, $WCl_6$, or $W[CO]_6$ and phosphorus precursor selected from the group comprising $PH_3$ or $POCl_4$.

16. The method of claim 15 wherein the metal silicide is deposited at a temperature of about 450–600° C. and pressure of about 1–5 Torr.

* * * * *